United States Patent [19]
Woolf

[11] 4,057,769
[45] Nov. 8, 1977

[54] CIRCUIT FOR GENERATING TWO DISTINCTIVE TONE BURSTS WITH EXPONENTIALLY DECAYING ENVELOPES

[75] Inventor: Lawrence Dudley Woolf, Jersey, Guernsey (Channel Islands.)

[73] Assignee: Rediffusion Reditronics Limited, Jersey, Guernsey (Channel Islands.)

[21] Appl. No.: 723,097

[22] Filed: Sept. 14, 1976

[30] Foreign Application Priority Data

Sept. 16, 1975 United Kingdom ............... 38002/75

[51] Int. Cl.² .......................... H03B 3/02; H03B 3/04
[52] U.S. Cl. .................... 331/49; 331/106; 331/108 D; 331/111; 331/173; 331/179; 340/329; 340/384 E
[58] Field of Search ..................... 331/49, 106, 108 D, 331/111, 173, 174, 179; 340/328, 329, 384 E

[56] References Cited

U.S. PATENT DOCUMENTS

| | | | |
|---|---|---|---|
| 3,693,110 | 9/1972 | Briggs, Jr. et al. | 331/179 X |
| 3,875,526 | 4/1975 | Beeman et al. | 331/179 X |
| 4,001,816 | 1/1977 | Yamada et al. | 340/384 E |

Primary Examiner—Siegfried H. Grimm
Attorney, Agent, or Firm—Laurence R. Brown

[57] ABSTRACT

An electrical signal generator comprises an electric wave oscillator for producing oscillations at one or other of two predetermined frequencies, an attenuator device for attenuating oscillations produced by the oscillator in a manner which varies over a period of time, and control means for controlling the oscillator to produce a burst of oscillations at one said predetermined frequency and a subsequent burst of oscillations at the other said predetermined frequency. The control means controls the attenuator device increasingly to attenuate the oscillations over the period of each burst.

11 Claims, 1 Drawing Figure

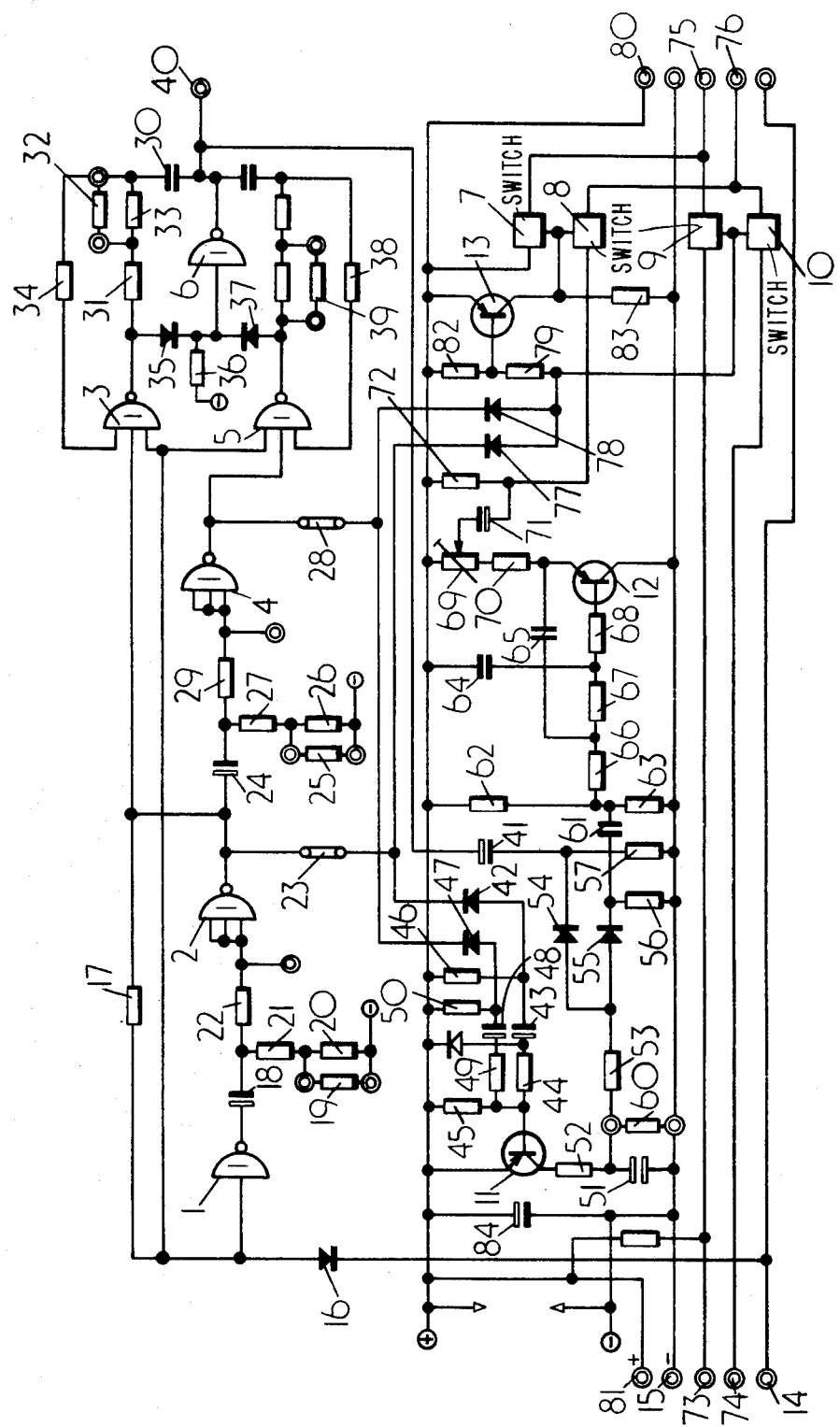

CIRCUIT FOR GENERATING TWO DISTINCTIVE TONE BURSTS WITH EXPONENTIALLY DECAYING ENVELOPES

This invention relates to electric signal generators and seeks to provide an improved form thereof. The invention is particularly concerned with means by which two distinct tone bursts with exponentially decaying envelopes may be generated. The means may be associated with a public address system to provide a sound which when preceding announcements may serve to increase listeners' attention thereto.

According to the present invention there is provided an electrical signal generator comprising an electric wave oscillator for producing oscillations at one or other of two predetermined frequencies, an attenuator device for attenuating oscillations produced by the oscillator in a manner which varies over a period of time, and control means for controlling the oscillator to produce a burst of oscillations at one said predetermined frequency and a subsequent burst of oscillations at the other said predetermined frequency, and for controlling the attenuator device increasingly to attenuate the oscillations over the period of each burst.

Further features and advantages of the invention will become apparent from the following description of one particular embodiment thereof given by way of example only, with reference to the accompanying drawing which is a schematic diagram of an electric signal generating means in accordance with the present invention.

The illustrated circuit uses three CMOS integrated circuits providing components 1, 2 and 3, 4, 5 and 6, and 7, 8, 9 and 10 and three silicon PNP bipolar transistors 11, 12 and 13.

When the circuit is activated, two consecutive pulses are produced, each of about 900mS duration. These are used to control the various functions of the rest of the circuit. The oscillator section is allowed to produce first a tone burst of 587 Hz followed by one at 494 Hz (musical notes 'D' and 'B'). The leading edge of each pulse resets an attenuator for minumum attenuation followed by an exponential decay. At this stage the tones are still square waves which are now passed through a low pass filter to produce a sinusoidal waveform with reduced harmonic content. This results in two harmonious bell-like chimes which are attenuated further and passed through an electronic switch. A normal signal channel is interrupted and the chime signals are applied to the signal channel by the electronic switches. At the end of the two pulse period the switch is reset to allow the microphone signal to pass through to the main amplifier.

A mixture of analogue and digital techniques is employed to produce and process the signals. The unit uses a positive earth reference for the analogue signals for compatability with existing forms of public address equipment. However, the detailed description of the circuit functions will consider the negative supply rail to be the reference for the logic functions and to represent Logic State 'O', with the positive rail as Logic State '1'.

Referring in detail to the drawing, the first pulse is initiated by placing a logic level 'O' at the input of a monostable that is formed by IC components 1 and 2. This is achieved by operation of a switch on an associated microphone (not shown) that connects board pins 14 and 15 to each other. A diode 16 prevents any positive voltage that may normally be present on the external equipment from reaching the input of IC component 1. A resistor 17 acts as a monostable pull-up resistor that normally maintains the same logic level at the input of IC component 1 as at the output of IC component 2. In the quiescent state the input of IC component 2 (which is connected as an inverter) is maintained at level 'O' which therefore holds its output at level '1' together with the input of IC component 1 which in turn has its output at level 'O'. The time constant of this circuit is determined by a capacitor 18 and the combination of resistors 19, 20 and 21 and also by the trigger point of IC component 2. The value of resistor 19 is determined in a test procedure. A resistor 22 minimises the effect on the time constant of the circuit of the internal protective diodes on the input of IC component 2 and so maintains the time constant under different supply voltages. This pulse may be observed with an oscilloscope connected to a link pin 23 located on a circuit board (not shown) next to the IC having components 1 and 2. This point is normally at logic level '1' and goes to level 'O' for the duration of the pulse.

A capacitor 24 is normally charged to the supply voltage and is discharged during the course of the first pulse. At the end of the first pulse when the output of IC component 2 returns to logic level '1' the input of IC component 4 which is also connected as an inverter, is pulled up to level '1' by capacitor 24 until capacitor 24 recharges through 25, 26 and 27 to the trigger point of IC component 4. During this period the second pulse may be observed at a link pin 28 next to the IC having components 4, 5 and 6. A resistor 29 has a similar function to resistor 22 and the time constant is preset by resistor 25.

The two pulses are used to control three circuit functions which are the two-tone oscillator, the attenuator and the switch.

The two-tone oscillator is formed from IC components 3, 5 and 6 and may be considered as two separate oscillators but with IC component 6 being common to both. IC components 3 and 5 are both three input NOR gates each with one input connected to an appropriate frequency determining feedback circuit and the other two inputs of each being at logic level '1' to inhibit the oscillators. In each case the oscillator is activated only when its two control inputs are both taken to logic level 'O'. One input control gate of each oscillator is taken to level '0' by diode 16 when the address system microphone is switched on. This also initiates the first pulse which takes the remaining input of component 3 to level 'O' and removes the inhibit from the first oscillator. The frequency of this is determined by capacitor 30 and resistor 31, 32 and 33, with resistor 32 being the trim resistor and a resistor 34 providing an impedance buffer similar to resistors 22 and 29. Diode 35 and resistor 36 allow the output of IC component 3 to be connected to the input of IC component 6 while a diode 37 isolates the output of component 5 which is being held at lever 'O'. At the end of the first pulse the first oscillator is again inhibited and now the second oscillator (IC components 5 and 6) is initiated for the duration of the second pulse. The frequency of the second oscillator is determined by similar circuitry to that of the first oscillator. A resistor 38 is equivalent to resistor 34 and the frequency is trimmed by a resistor 39. The functions of diodes 35 and 37 are reversed.

During both periods of oscillation the output may be observed at pin 40 before it is coupled to the attenuator by a capacitor 41. The oscillation waveform is a square wave whose peak-to-peak amplitude is approximately that of the supply voltage.

The two pulses are applied to the rest of the circuit via links 23 and 28.

When the first pulse passed via link 23 takes a diode 42 to level 'O', transistor 11 is switched on for a short time until a capacitor 43 is charged through resistor 44 and the voltage across resistor 45 drops below 0.6V. At the end of the pulse capacitor 43 discharges through resistors 44, 45 and 46. Similarly the second pulse via link 28 and diod 47 switches on transistor 11 for a short period until capacitor 48 is charged. Capacitor 48 then discharges, at the end of the pulse through resistors 45, 49 and 50. At the beginning of each pulse, when transistor 11 is switched on, a capacitor 51 is rapidly charged through resistor 52 which limits the maximum current through transistor 11. Each time transistor 11 stops conducting, capacitor 51 discharges through resistor 53, diodes 54 and 55 and resistors 56 and 57 which form a voltage controlled attenuator. During the positive peaks of the oscillator signal diode 54 is reverse biased and therefore does not conduct. The voltage at the junction of diode 55 and resistor 56 is then dependant on the voltage across capacitor 51 and the potential divider formed by resistors 53 and 56. As the voltage across capacitor 51 decays exponentially, so does the peak voltage that can appear across resistor 56. During negative peaks of the oscillator signal the cathode of diode 54 is brought to the negative rail so that diode 55 no longer conducts. The peak to peak voltage across resistor 56 is approximately half the d.c. voltage across capacitor 51 as resistors 56, 57 and 53 are of equal values. The discharge time of capacitor 51 is reduced by a resistor 60 if fitted.

The tones, now with the appropriate envelope shaping are taken to the input of the low pass filter by a capacitor 61. The value of capacitor 61 is low so as to minimise the low frequency components of the switching transients.

Transistor 12 is used as a low pass filter. It is biased by resistors 62 and 63. The roll-off characteristic is defined by capacitors 64 and 65 and resistor 66 and 67. A resistor 68 improves the stability of this stage. As the output at the emitter is much greater than required, it is attenuated further by resistors 69 and 70. Resistor 69 is a preset potentiometer to set the output to the required level. The output from the slider of resistor 69 is coupled to the electronic switch formed by IC components 7, 8, 9 and 10 by capacitor 71 which is polarised by a resistor 72.

The IC electronic switch 7, 8, 9 and 10 normally allows the balanced input at board pins 73 and 74 to be connected directly to board pins 75 and 76 via IC components 9 and 10.

When the pulses appear at links 23 and 28 firstly diode 77 and then diode 78 conduct and switch on transistor 13 via resistor 79. IC components 9 and 10 are now switched off, components 7 and 8 being switched on instead. The output at board pin 75 is grounded to the positive rail (Board pins 80 and 81)and the unbalanced chime signal from capacitor 71 appears at board pin 76. At the end of the pulses resistor 82 holds transistor 13 off, resistor 79 switches IC components 9 and 10 on, and resistor 83 switches IC components 7 and 8 off so that the balanced signal from the microphone from board pins 73 and 74 is again connected through to board pins 75 and 76.

The first or second chime may be inhibited by removal of line 23 or link 28 respectively. Removal of link 23 is not recommended as there would then be a pause before the chime is produced, during which the microphone is switched through.

Capacitor 84 smooths any ripple that might appear on the supply rails.

As mentioned, the above described chime generator uses a positive earth reference for compatability with many existing forms of public address equipment but where the supply available has a negative earth reference a CMOS oscillator used as a D.C. to D.C. converter may be added.

In some case there may be an interface problem between the output of the generator described and some makes of equipment but this may be resolved by providing a relay controlled by the output of the generator, the relay contacts being arranged to switch the equipment. One or more resistors may be included in series with the relay contacts to limit the peak current when switching capacitive loads.

In the chime generator arrangement described, the audio signal is muted during the chime period. If desired, the chimes may instead be mixed with the audio signal.

What is claimed is:

1. An electrical signal generator comprising an electric wave oscillator, for producing oscillations at two predetermined frequencies and having two separate input circuits respectively to provide oscillations at said two frequencies and a common output circuit for providing the oscillations, an attenuator device coupled to said output circuit for attenuating oscillations produced by the oscillator in a manner which varies over a period of time, control means connected with the two oscillator input circuits to produce a burst of oscillations at one said predetermined frequency and a subsequent burst of oscillations at the other said predetermined frequency, and said control means further being connected with the attenuator device to set the attenuator for decay of the oscillations over the priod of each burst.

2. An electrical signal generator according to claim 1, wherein each input circuit comprises a NOR gate, a first input of which is connected to a respective frequency determining feedback circuit coupled with said output circuit.

3. An electrical signal generator acording to claim 2, wherein each input circuit comprises a three input NOR gate, having a second input arranged for connection in use to a manual switch and a further input connected to said control means.

4. An electrical signal generator according to claim 1, wherein the control means comprises a monostable responsive to generate an output signal in response to an input control signal and an inverter connected to the output of the monostable, the outputs of the monostable and inverter being applied to control said input circuits of the oscillator and the attenuator device.

5. An electrical signal generator according to claim 4, wherein each input circuit comprises a NOR gate and the outputs of the monostable and inverter are applied to inputs of respective ones of the two NOR gates.

6. An electrical signal generator according to claim 4, wherein the attenuator comprises a timing circuit normally connected to the outputs of the monostable and the inverter via respective diodes, the diodes being arranged to be rendered conductive in response to outputs of the monostable and inverter to set the timing circuit.

7. An electrical signal generator according to claim 6, wherein the timing circuit comprises a capacitor connected to a transistor which is arranged to be biased to its conductive state by the outputs of the monostable and inverter to charge the capacitor.

8. An electrical signal generator according to claim 7, comprising a network of resistors and diodes forming with said attenuator a voltage controlled attenuator for the oscillations provided by the oscillator, the said capacitor discharging through the said network when the transistor is non-conductive.

9. An electrical signal generator according to claim 8, wherein the network comprises two diodes coupled between the oscillator output and said attenuator resistors respectively non-conducting during positive and negative peaks of the oscillations.

10. An electrical signal generator according to claim 1, comprising switches for interrupting a normal signal channel and connecting the output of the attenuator device to the signal channel, the switches being controlled by the control signals provided by said control means circuitry.

11. An electrical signal generator according to claim 1, having a normal signal channel for conveying messages comprising switching means for switching the output of the attenuator device into the normal signal channel under control of the control signals provided by said control means circuitry.

* * * * *